US009383196B2

(12) United States Patent
Yahav et al.

(10) Patent No.: US 9,383,196 B2
(45) Date of Patent: Jul. 5, 2016

(54) SYSTEM, METHOD AND COMPUTED READABLE MEDIUM FOR EVALUATING A PARAMETER OF A FEATURE HAVING NANO-METRIC DIMENSIONS

(71) Applicant: APPLIED MATERIALS ISRAEL, LTD., Rehovot (IL)

(72) Inventors: Yuval Yahav, Tel Aviv (IL); Ofer Adan, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 548 days.

(21) Appl. No.: 13/787,645

(22) Filed: Mar. 6, 2013

(65) Prior Publication Data

US 2014/0098211 A1 Apr. 10, 2014

Related U.S. Application Data

(60) Provisional application No. 61/608,487, filed on Mar. 8, 2012.

(51) Int. Cl.
*G06T 7/00* (2006.01)
*G01B 15/00* (2006.01)
*H01J 37/22* (2006.01)
*G06T 7/60* (2006.01)
*G03F 7/20* (2006.01)

(52) U.S. Cl.
CPC ............ *G01B 15/00* (2013.01); *G03F 7/70616* (2013.01); *G06T 7/602* (2013.01); *H01J 37/222* (2013.01); *G06T 2207/10061* (2013.01); *G06T 2207/30148* (2013.01); *H01J 2237/24578* (2013.01)

(58) Field of Classification Search
CPC ................. G06T 7/602; G06T 2207/10061; G06T 2207/30148; H01J 2237/24578; G01B 15/00; G03F 7/7016
USPC ....................... 348/79, 80, 126, 135
See application file for complete search history.

(56) References Cited

U.S. PATENT DOCUMENTS

| 4,947,323 | A | * | 8/1990 | Smith ........................... 382/132 |
| 4,956,230 | A | * | 9/1990 | Edwards et al. ............ 428/32.14 |
| 5,629,772 | A | * | 5/1997 | Ausschnitt ............. G01B 11/02 356/625 |
| 5,712,707 | A | * | 1/1998 | Ausschnitt .......... G03F 7/70633 148/DIG. 102 |
| 5,757,507 | A | * | 5/1998 | Ausschnitt .......... G03F 7/70633 250/548 |

(Continued)

FOREIGN PATENT DOCUMENTS

JP       02001257922 A  *  9/2001

*Primary Examiner* — David Harvey
(74) *Attorney, Agent, or Firm* — Kilpatrick Townsend & Stockton LLP (57) ABSTRACT

A non-transitory computer readable medium, a system and a method. The method may include obtaining, by an image obtaining module, an image of a measurement site, the measurement site comprise the feature, the image of the measurement site comprises an image of the feature; processing, by an image processor, the image of the measurement site to provide an artificial image, the artificial image comprise a artificial image of an artificial feature, the artificial feature differs from the feature; measuring a parameter of the artificial feature to provide a measurement result, wherein the measuring comprises applying a measurement algorithm that is inadequate for measuring the parameter of the feature; and determining a value of the parameter of the feature in response to the measurement result.

22 Claims, 7 Drawing Sheets

(56) References Cited

U.S. PATENT DOCUMENTS

| | | | | |
|---|---|---|---|---|
| 5,790,254 | A * | 8/1998 | Ausschnitt | G03F 7/70633 356/603 |
| 5,832,422 | A * | 11/1998 | Wiedenhoefer | 702/154 |
| 6,107,356 | A * | 8/2000 | DesMarais | A61L 15/425 521/142 |
| 6,183,919 | B1 * | 2/2001 | Ausschnitt | G01B 11/02 430/22 |
| 7,198,901 | B1 * | 4/2007 | Rachlin | B01L 3/5085 422/68.1 |
| 7,361,941 | B1 * | 4/2008 | Lorusso | G01B 11/24 257/100 |
| 2002/0117618 | A1 * | 8/2002 | Schatz | G03F 7/70625 250/307 |
| 2006/0103836 | A1 * | 5/2006 | Levinski | G03F 1/14 356/123 |
| 2007/0206275 | A1 * | 9/2007 | Hemmer et al. | 359/385 |
| 2008/0059286 | A1 * | 3/2008 | Nickerson | G06Q 10/10 705/7.32 |
| 2010/0278311 | A1 * | 11/2010 | Hammerstrom et al. | 378/163 |
| 2010/0305857 | A1 * | 12/2010 | Byrne | G06T 7/0042 701/301 |
| 2011/0151190 | A1 * | 6/2011 | Chung | B82Y 10/00 428/143 |
| 2011/0157407 | A1 * | 6/2011 | Lin | G06K 9/036 348/222.1 |
| 2011/0196661 | A1 * | 8/2011 | Spicola | A01K 29/00 703/11 |
| 2012/0081712 | A1 * | 4/2012 | Laengle | 356/620 |
| 2012/0176618 | A1 * | 7/2012 | Vagos | G01N 21/23 356/369 |

\* cited by examiner

SYSTEM, METHOD AND COMPUTED READABLE MEDIUM FOR EVALUATING A PARAMETER OF A FEATURE HAVING NANO-METRIC DIMENSIONS

CROSS-REFERENCES TO RELATED APPLICATIONS

This application claims the benefit of U.S. Provisional Patent Application No. 61/608,487, filed Mar. 8, 2012, which is incorporated herein by reference for all purposes.

BACKGROUND OF THE INVENTION

In photolithography, critical dimension (CD) is the minimum feature size that is to be patterned on the wafer or the minimal distance between adjacent features. The features can be lines but other features can be provided.

Critical dimension scanning electron microscopes (CD-SEM) are used to measure critical dimensions of such features by scanning an area of the wafer that includes such features with an electron beam to provide an SEM image.

A typical CD-SEM is adapted to measure lines or vias. There is a growing need to provide a CD-SEM that can measure other features.

BRIEF SUMMARY OF THE INVENTION

Embodiments of the present invention pertain to CD-SEM that can measure various parameters of various features, including parameters of features that are not included in a predefined set of measurable features as well as to methods of using such a tool to evaluate features having nano-metric dimensions.

Some embodiments pertain to a method for evaluating a parameter of a feature having nano-metric dimensions and may include obtaining, by an image obtaining module, an image of a measurement site, the measurement site comprise the feature, the image of the measurement site comprises an image of the feature; processing, by an image processor, the image of the measurement site to provide a artificial image, the artificial image comprise a artificial image of a artificial feature, the artificial feature differs from the feature; measuring a parameter of the artificial feature to provide a measurement result, wherein the measuring comprises applying a measurement algorithm that is inadequate for measuring the parameter of the feature; and determining a value of the parameter of the feature in response to the measurement result.

The processing may include mirroring the image of the feature to provide the image of the artificial feature.

The method may include mirroring the image of the feature and copying at least one portion of the image of the measurement site to the artificial image.

The processing may include combining multiple images of the feature to provide the artificial image of the artificial feature.

The method may include combining multiple images of the feature and copying at least one portion of the image of the measurement site to the artificial image.

The method may include rotating at least one image of the feature in relation to at least one other image of the feature to be combined to form the artificial image of the artificial feature.

The method may include changing a size of at least one image of the feature to be used for forming the artificial image of the artificial feature.

In various embodiments the artificial feature may be an ellipse, a polygon that includes multiple edges or a feature that includes at least one linear portion and at least one non-linear portion.

In some embodiments where the artificial feature is a polygon, each edge of the polygon may be parallel to another edge of the polygon.

The processing may include combining at least one portion of image of the feature to at least one image of the feature to provide the artificial image of the artificial feature.

The method may include obtaining, by the image obtaining module, images of multiple measurement sites, each measurement site comprise an instance of the feature, each image of each measurement site may include an image of an instance of the feature; repeating, for each measurement site, the stages of: processing, by an image processor, the image of the measurement site to provide a artificial image, the artificial image comprise a artificial image of a artificial feature, the artificial feature differs from the feature; measuring a parameter of the artificial feature to provide a measurement result, wherein the measuring may include applying a measurement algorithm that is inadequate for measuring the parameter of the feature; and determining a value of the parameter of the feature in response to the measurement result.

The measuring algorithm may be adapted to measure the parameter of the feature and to measure at least one parameter of an additional feature; wherein the processing may include combining at least one portion of the image of the feature and at least one portion of an image of the additional feature to provide the artificial image of the artificial feature.

The method may include combining at least one image of the feature and at least image of the additional feature to provide the artificial image of the artificial feature The method may include copying at least one portion of the image of the measurement site to the artificial image.

The method may include rotating at least one image of the feature in relation to at least one image of the additional feature to be used for forming the artificial image of the artificial feature.

The method may include changing a size of at least one image of the feature to be used for forming the artificial image of the artificial feature.

The method may include rotating at least one image of the additional feature in relation to at least one image of the feature to form the artificial image of the artificial feature.

The method may include changing a size of at least one image of the additional feature to be used for forming the artificial image of the artificial feature.

According to an embodiment of the invention there may be provided a non-transitory computer program product that stores instructions for: obtaining an image of a measurement site, the measurement site may include a feature, the image of the measurement site may include an image of the feature; processing, by an image processor, the image of the measurement site to provide a artificial image, the artificial image comprise a artificial image of a artificial feature, the artificial feature differs from the feature; measuring a parameter of the artificial feature to provide a measurement result, wherein the measuring may include applying a measurement algorithm that is inadequate for measuring the parameter of the feature; and determining a value of the parameter of the feature in response to the measurement result.

The non-transitory can store instructions for executing any state or any combination of stages of any method mentioned in the specification.

Some embodiments pertain to a system that may include an image obtaining module, arranged to obtain an image of a measurement site, the measurement site comprise the feature, the image of the measurement site may include an image of the feature; an image processor arranged to process the image of the measurement site to provide a artificial image, the artificial image comprise a artificial image of a artificial feature, the artificial feature differs from the feature; a measurement module arranged to measure a parameter of the artificial feature to provide a measurement result, wherein the measuring may include applying a measurement algorithm that is inadequate for measuring the parameter of the feature; and to determine a value of the parameter of the feature in response to the measurement result.

The system may execute any stage or any combination of stages of any method mentioned in the specification.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In this specification any reference to a method refers mutatis mutandis to a system capable of executing the method and to a computer readable medium that stores instructions that once executed may result in an execution of the method.

The method can measure a parameter of a feature even if that parameter of that feature cannot be adequately measured by a measurement algorithm applied by the method. The inadequacy of the measurement algorithm can result in unacceptable accuracy of that measurement algorithm or in a disability of the measurement algorithm to measure that parameter of that feature. For example, a measurement algorithm that can only measure the distance between two linear lines or can only measure the area of an ellipse or of a rectangle but cannot measure the area of feature that has a shape of a half circle. Yet for another example—a measurement algorithm is tailored to measure contacts, lines, spaces (of substantially cylindrical shape), pitches, minimum between line ends is not adapted to measure the area of a feature that has a shape of a half ellipse.

The method may use such a measurement algorithm to measure a parameter of a synthetic feature that is synthesized from one or more features that cannot be evaluated by the measurement algorithm. The measurement result and a mapping between the synthetic feature and the one or more features is used to determine the parameter of the feature that should be evaluated by the method.

Accordingly, a method may be provided that utilizes measurement algorithms for certain features for measuring parameters of other features—thus expanding the capabilities of already deployed measurement tools.

For simplicity of explanation a feature that has a parameter that can be adequately measured by a measurement algorithm is referred to a measurable feature. A feature that has a parameter that cannot be adequately measured by the measurement algorithm is referred to as an un-measurable feature.

The method can use tested measurement algorithms to measure new features.

The method can be used in a semiconductor manufacturing process development or monitoring, and can include receiving measurement results associated with a measurement site, comprising an image file including a un-measurable feature, and corresponding measurement information; defining a set of operations to be performed on said un-measurable feature; performing said set of operations on a plurality of image files associated with additional measurement sites; and analyzing said images using metrology algorithms suitable for measuring measurable features The measurable features can be lines/spaces or contact holes.

The measurable features can be transistors having poly-silicon gate over active area and wherein electric performance of said measurable features is defined by measured width and length of said poly-silicon gate over active area.

The un-measurable feature can be a feature of a transistor having a poly-silicon gate over active area and wherein electric performance of said un-measurable feature can be defined by measured width and length of said poly-silicon gate over active area and by an additional feature elements which cannot be directly expressed as a line or a space.

The measurable feature can be are contacts or vias residing between metal layers and front-end layer and having a substantial circular shape, wherein electric performance of said measurable features is defined by an area of said circular shape.

An un-measurable feature may have a curved shape substantially different than a circular shape.

An un-measurable feature can be defined by features residing on a same layers or on different layers.

The set of operations can be defined as a set of operations required for expressing said un-measurable feature as a combination of lines and circular shapes.

The set of operations can include cutting, combining, mirroring, duplicating, rotating, expanding, shrinking, and overlapping.

The method can be performed as an off-line step.

The method may also include prior to said defining, eliminating image distortions.

There may be provided an improved method for CDSEM measurement, that may include receiving CDSEM measurement results including measurement results in the form of image files; identifying at least one un-measurable feature in at least one image file; defining a set of operations and performing said set of operations on said image files to thereby generate artificial image files including one or more artificial measurable features indicative of said un-measurable feature; measuring said one or more artificial measurable features using metrology algorithms suitable for measuring measurable features.

Figure 1:
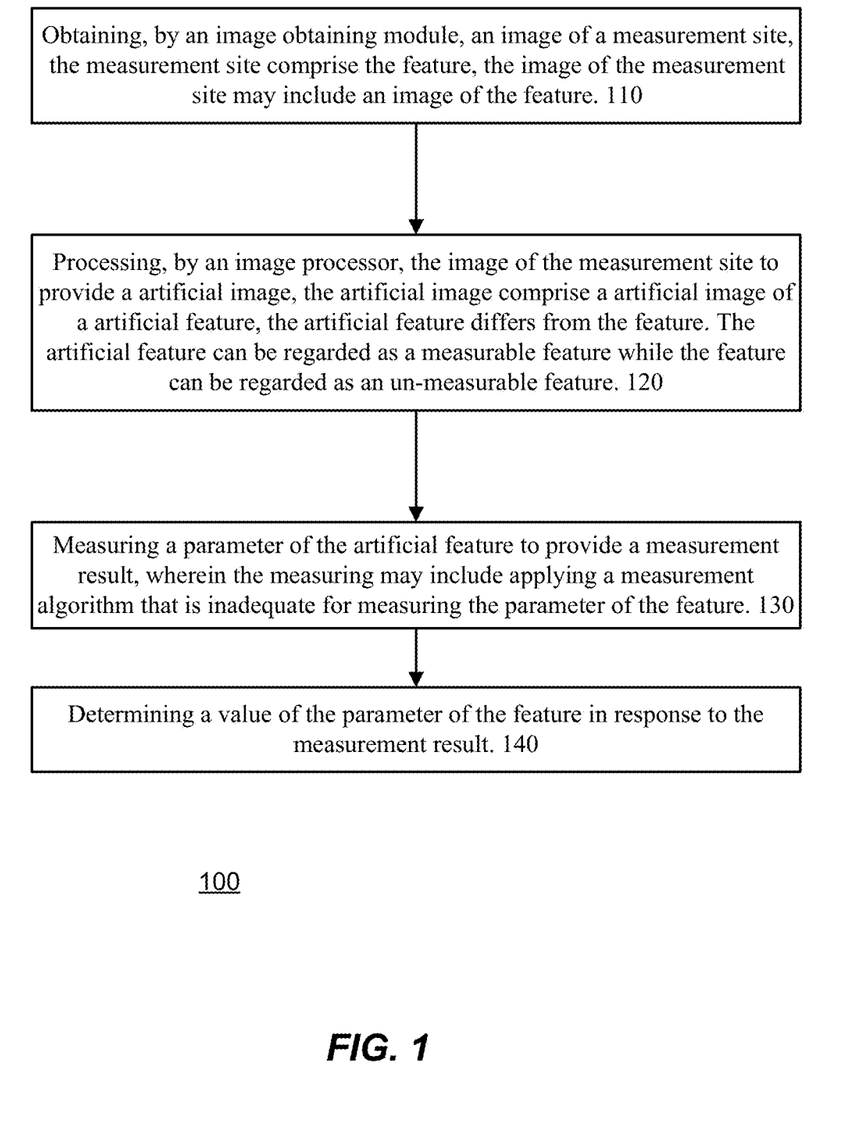
FIG. 1 illustrates a method, according to an embodiment of the invention.

FIG. 1 illustrates method 100 for evaluating a parameter of a feature having nano-metric dimensions, according to an embodiment of the invention.

Method 100 may start by stage 110 of obtaining, by an image obtaining module, an image of a measurement site, the measurement site comprise the feature, the image of the measurement site may include an image of the feature.

Stage 110 may be followed by stage 120 of processing, by an image processor, the image of the measurement site to provide a artificial image, the artificial image comprise a artificial image of a artificial feature, the artificial feature differs from the feature. The artificial feature can be regarded as a measurable feature while the feature can be regarded as an un-measurable feature.

Stage 120 can be followed by stage 130 of measuring a parameter of the artificial feature to provide a measurement result, wherein the measuring may include applying a measurement algorithm that is inadequate for measuring the parameter of the feature.

Stage 130 may be followed by stage 140 of determining a value of the parameter of the feature in response to the measurement result.

The parameter of the feature can be the same parameter of the synthetic feature. The parameter of the feature can differ from the parameter of the synthetic feature.

The parameter can be a spatial parameter (size, area, distance between points, uniformity, width of line), an electrical parameter or any other type of parameter.

Stage 120 may include cutting the image of the feature, combining one or more portions of one or more images of the feature, mirroring one or more images of the feature, duplicating one or more images of the feature, rotating one or more images of the feature, expanding one or more images of the feature, shrinking one or more images of the feature, and overlapping one or more images of the feature. Each reference to the image of the feature should be applied also to an image of a portion of the feature. The one or more images of the feature may indicate one or more instances of the same image of the feature.

Figure 2:
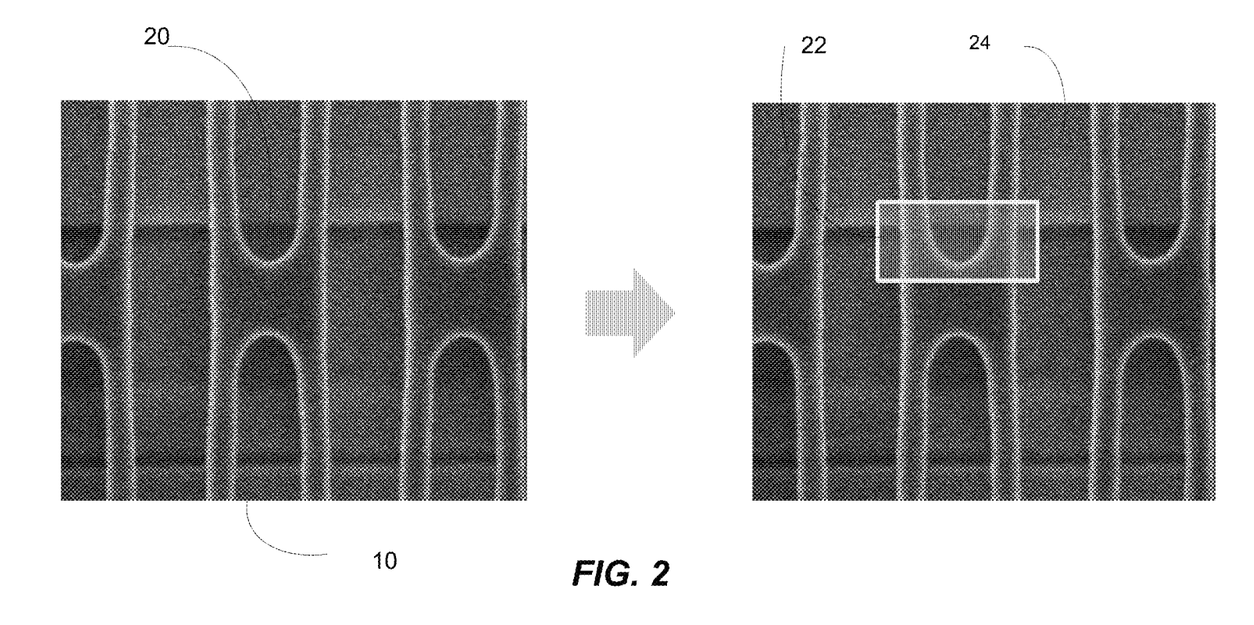
FIGS. 2-6 illustrate a image of a measurement site, a synthetic image, and various measurements of a synthetic feature, according to various embodiments of the invention.
Figure 3:
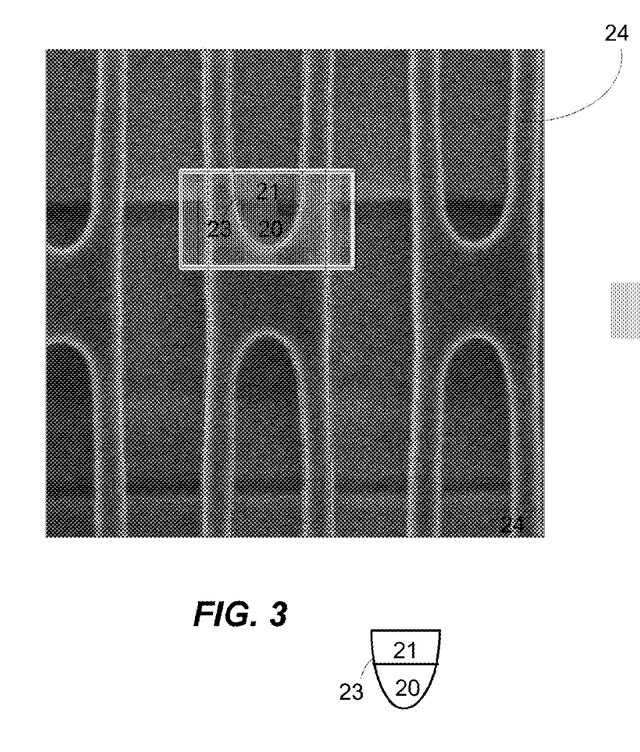
Figure 4:
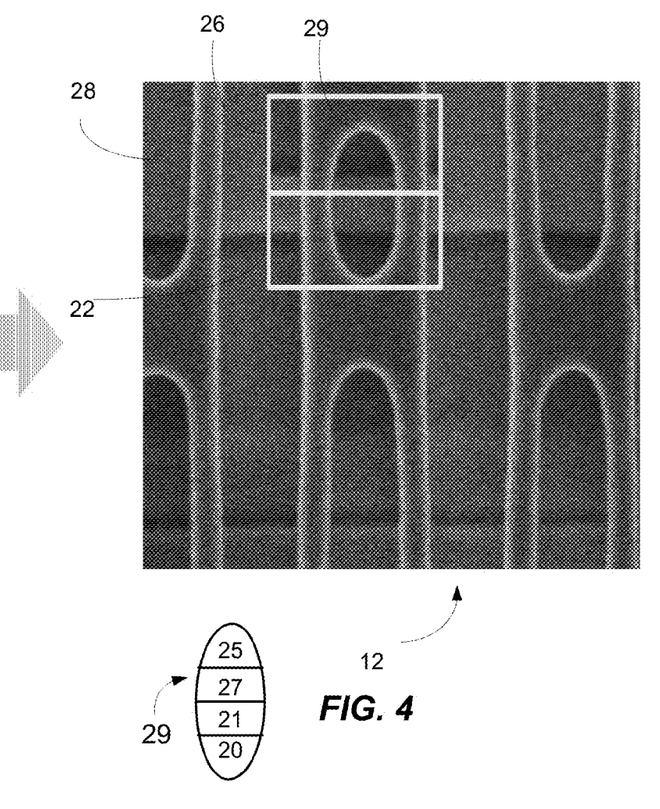
Figure 5:
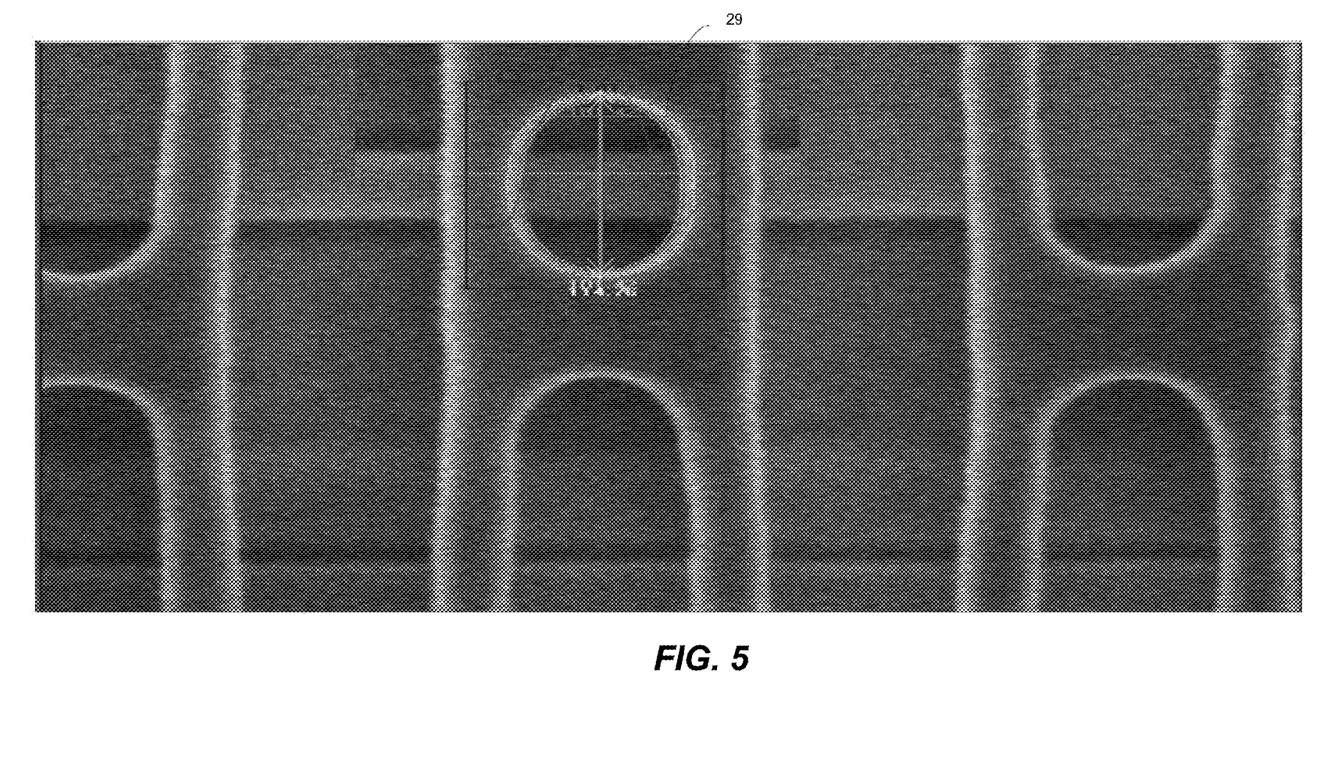
Figure 6:
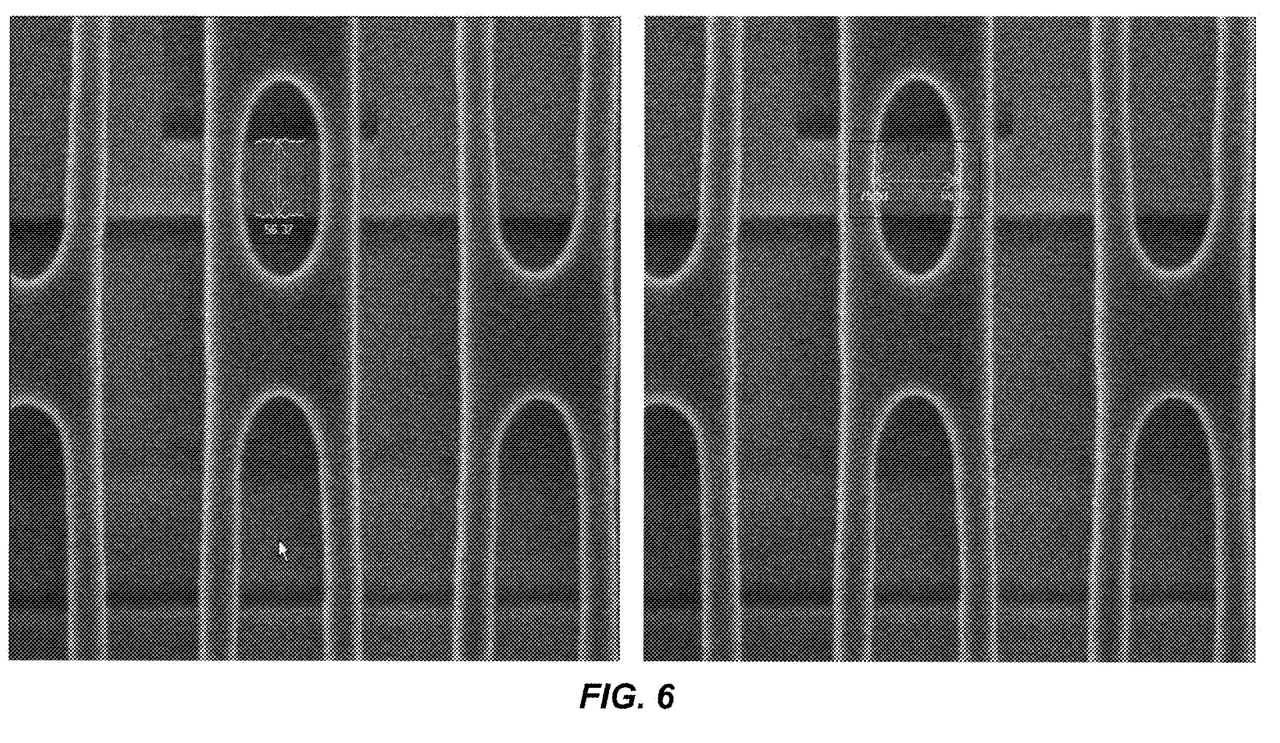

For example, the processing may include mirroring the image of the feature to provide the image of the artificial feature. This is illustrated in FIGS. 2-4 in which an image of an un-measurable half-ellipse shaped feature 20 is duplicated to provide a synthetic image of an ellipse 30—that can be measured by the measurement algorithm. After the area of the ellipse is measured—the area of the half-ellipse shaped feature can be calculated as one half of the area of the ellipse.

The other portions of the image of the measurement site can remain unchanged or can be changed.

FIGS. 2-6 illustrate an image of a measurement site, a synthetic image, and various measurements of a synthetic feature, according to various embodiments of the invention.

Image 10 of a measurement site reveals a feature 20 that has a half ellipse shape that its area can not be adequately measured by a measurement algorithm that should be applied during the measurement process.

A window 22 is defined and includes the feature 20 and its vicinity. The remaining part of the image 10 is denoted 24.

The window 22 is going to be mirrored along its upper edge. The gap between the top of feature 20 and the upper edge is denoted 21. Gap 21 and feature 22 form an intermediate feature 23 that has a shape of half of an ellipse.

A synthetic image 12 is formed by mirroring image 22 so that feature 22 is mirrored by mirrored feature 25 and gap 21 is mirrored by mirrored gap 27. Feature 20, gap 21, mirrored gap 27 and mirrored feature 25 form a synthetic feature 29 that a shape of an ellipse.

The size of the synthetic feature 29 is calculated (FIG. 5), the size of the area of the gap 21 and mirrored gap 27 is calculated (FIG. 6) and subtracted from the size of the synthetic feature 29 to provide the area of the feature 20 and the mirrored feature 29. The area of the feature 20 is calculated by dividing the last area by two.

Figure 7:
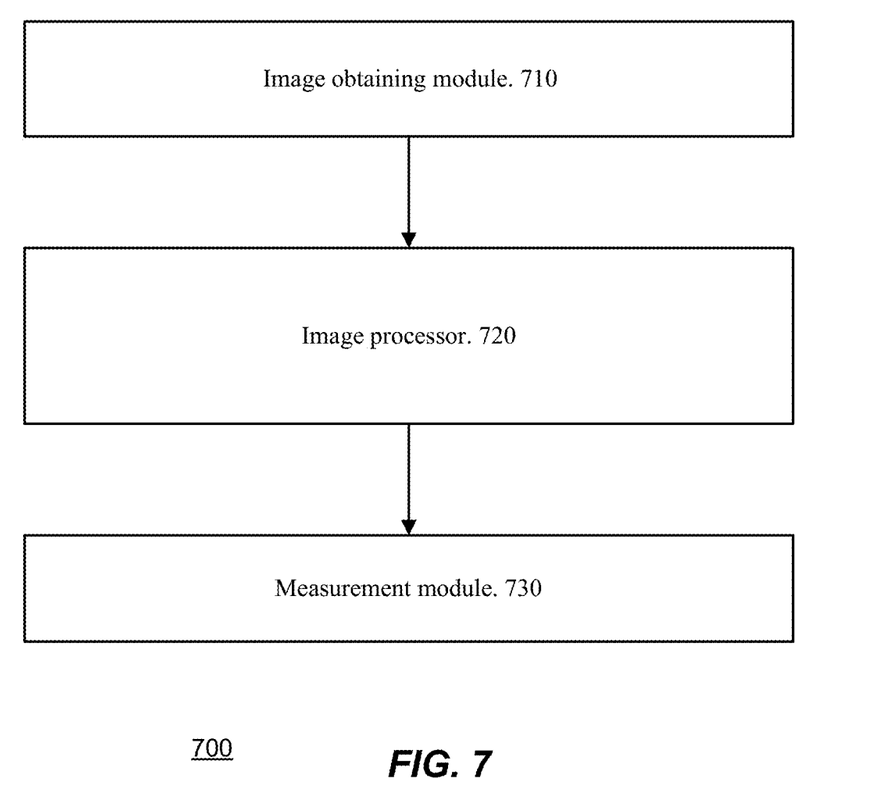
FIG. 7 illustrates a system according to an embodiment of the invention.
Figure 8:
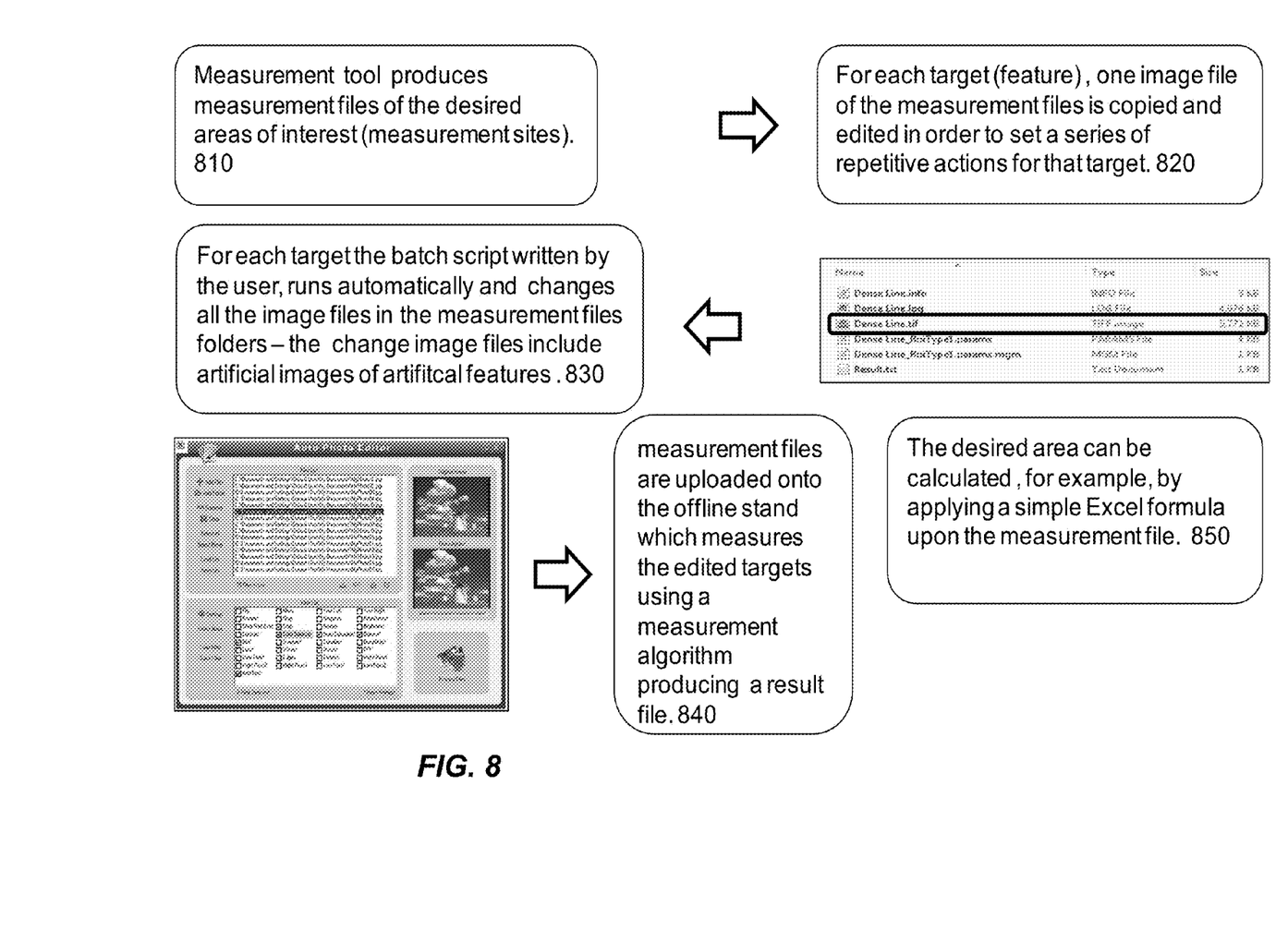
FIG. 8 illustrates a method according to another embodiment of the invention.

FIG. 7 illustrates system 700 according to an embodiment of the invention.

System 700 may execute method 100 or any other method mentioned in this specification.

System 700 may include: (a) an image obtaining module 710, arranged to obtain (electronically, optically, by using a scanning electron microscope, by receiving a representation of images acquired from a scanning electron microscope) an image of a measurement site, the measurement site comprise the feature, the image of the measurement site comprises an image of the feature; (b) an image processor 720 arranged to process the image of the measurement site to provide a artificial image, the artificial image comprise a artificial image of a artificial feature, the artificial feature differs from the feature; and (c) a measurement module 730 arranged to measure a parameter of the artificial feature to provide a measurement result, wherein the measuring comprises applying a measurement algorithm that is inadequate for measuring the parameter of the feature; and to determine a value of the parameter of the feature in response to the measurement result.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for evaluating a parameter of a real feature having nano-metric dimensions, the method comprising:
obtaining, by an image obtaining module of an electronic microscope, an image of a measurement site that includes the real feature;
processing, by an image processor, the image of the measurement site to provide an artificial image of a continuous undivided artificial feature, the artificial feature representing an unknown dimension and from the real feature in shape;
measuring a parameter of the artificial feature to provide a measurement result by applying a measurement algorithm that is inadequate for directly measuring the parameter of the real feature; and
determining a value of the parameter of the real feature in response to the measurement result.

2. The method according to claim 1 wherein the processing comprises mirroring an image of the real feature to provide the image of the artificial feature.

3. The method according to claim 1 comprising mirroring an image of the real feature and copying at least one portion of the image of the measurement site to provide the artificial image.

4. The method according to claim 1 wherein the processing comprises combining multiple images of the real feature to provide the artificial image of the artificial feature.

5. The method according to claim 4 comprising combining multiple images of the real feature and copying at least one portion of the image of the measurement site to provide the artificial image.

6. The method according to claim 4 comprising rotating at least one image of the real feature in relation to at least one other image of the real feature to be combined to form the artificial image of the artificial feature.

7. The method according to claim 4 comprising changing a size of at least one image of the real feature to be used for forming the artificial image of the artificial feature.

8. The method according to claim 1 wherein the artificial feature is an ellipse.

9. The method according to claim 1 wherein the artificial feature is a polygon that comprises multiple edges.

10. The method according to claim 9 wherein each edge of the polygon is parallel to another edge of the polygon.

11. The method according to claim 1 wherein the artificial feature comprises at least one linear portion and at least one non-linear portion.

12. The method according to claim 1 wherein the processing comprises combining at least one portion of an image of the real feature with at least one image of the real feature to provide the artificial image of the artificial feature.

13. The method according to claim 1 comprising:
obtaining, by the image obtaining module, images of multiple measurement sites, each measurement site comprising an instance of the real feature;
repeating, for each measurement site, the stages of:
processing, by an image processor, the image of the measurement site to provide an artificial image of a continuous undivided artificial feature, the artificial feature differs from the real feature in shape;
measuring a parameter of the artificial feature to provide a measurement result, wherein the measuring comprises applying a measurement algorithm that is inadequate for directly measuring the parameter of the real feature; and
determining a value of the parameter of the real feature in response to the measurement result.

14. The method according to claim 1 wherein the measuring algorithm is adapted to measure the parameter of the real feature and to measure at least one parameter of an additional feature; and wherein the processing comprises combining at least one portion of an image of the real feature and at least one portion of an image of the additional feature to provide the artificial image of the artificial feature.

15. The method according to claim 14 comprising combining at least one image of the real feature and at least one image of the additional feature to provide the artificial image of the artificial feature.

16. The method according to claim 14 comprising copying at least one portion of the image of the measurement site to provide the artificial image.

17. The method according to claim 14 comprising rotating at least one image of the real feature in relation to at least one image of the additional feature to be used for forming the artificial image of the artificial feature.

18. The method according to claim 17 comprising changing a size of at least one image of the real feature to be used for forming the artificial image of the artificial feature.

19. The method according to claim 14 comprising rotating at least one image of the additional feature in relation to at least one image of the real feature to form the artificial image of the artificial feature.

20. The method according to claim 19 comprising changing a size of at least one image of the additional feature to be used for forming the artificial image of the artificial feature.

21. A non-transitory computer-readable medium including machine-readable instructions stored thereon that, when executed by one or more processing units associated with a scanning electronic microscope (SEM), cause:
the SEM to obtain an image of a measurement site that includes a real feature;
the SEM to process the image of the measurement site to provide an artificial image of a continuous undivided artificial feature, the artificial feature representing an unknown dimension and differing from the real feature in shape;
the SEM to measure a parameter of the artificial feature to provide a measurement result by applying a measurement algorithm that is inadequate for directly measuring the parameter of the real feature; and the SEM to determine a value of the parameter of the real feature in response to the measurement result.

22. A system comprising:

an image obtaining module configured to obtain an image of a measurement site that includes a real feature;

an image processor configured to process the image of the measurement site to provide an artificial image of a continuous undivided artificial feature, wherein the artificial feature represents an unknown dimension and differs from the real feature in shape; and a measurement module configured to (i) measure a parameter of the artificial feature to provide a measurement result by applying a measurement algorithm that is inadequate for directly measuring a parameter of the real feature; and (ii) determine a value of the parameter of the real feature in response to the measurement result.

\* \* \* \* \*